(12) United States Patent
Walker

(10) Patent No.: US 7,410,845 B2
(45) Date of Patent: Aug. 12, 2008

(54) DUAL-GATE DEVICE AND METHOD

(76) Inventor: Andrew J. Walker, 1638 Cornell Dr., Mountain View, CA (US) 94040

( * ) Notice: Subject to any disclaimer, the term of this patent is extended or adjusted under 35 U.S.C. 154(b) by 57 days.

(21) Appl. No.: 11/613,102

(22) Filed: Dec. 19, 2006

(65) Prior Publication Data
US 2007/0099381 A1 May 3, 2007

Related U.S. Application Data

(62) Division of application No. 11/197,462, filed on Aug. 3, 2005.

(51) Int. Cl.
*H01L 21/84* (2006.01)
*H01L 21/00* (2006.01)
*H01L 21/336* (2006.01)

(52) U.S. Cl. .................. 438/157; 438/257; 438/259; 438/270; 257/E21.659; 257/E21.679

(58) Field of Classification Search .......... 438/157, 438/257, 259, 270; 257/E21.659, E21.679
See application file for complete search history.

(56) References Cited

U.S. PATENT DOCUMENTS

| | | | |
|---|---|---|---|
| 5,574,294 | A | 11/1996 | Shepard |
| 6,054,734 | A * | 4/2000 | Aozasa et al. ............... 257/315 |
| 6,200,865 | B1 * | 3/2001 | Gardner et al. ............. 438/291 |
| 2005/0035418 | A1 | 2/2005 | Budge et al. |
| 2006/0281260 | A1 * | 12/2006 | Lue ............................ 438/264 |
| 2007/0096204 | A1 * | 5/2007 | Shiratake ................... 257/330 |
| 2008/0070363 | A1 * | 3/2008 | Mokhlesi ................... 438/266 |

* cited by examiner

*Primary Examiner*—Scott B. Geyer
*Assistant Examiner*—Mohsen Ahmadi
(74) *Attorney, Agent, or Firm*—Edward C. Kwok; MacPherson Kwok Chen & Heid LLP

(57) ABSTRACT

A memory circuit having dual-gate memory cells and a method for fabricating such a memory circuit are disclosed. The dual-gate memory cells each include a memory device and an access device sharing a semiconductor layer, with their respective channel regions provided on different surfaces of the semiconductor layer. The semiconductor layer has a thickness, such that when a pass voltage is applied to the gate electrode of the access device, the access device and the memory device remains isolated, such that the charge stored in the memory device is unaffected by the pass voltage. The pass voltage is determined from a range of voltages, when applied to the access device, has no effect on the threshold voltage of the memory device. The dual-gate memory cells can be used as building blocks for a non-volatile memory array, such as a memory array formed by NAND-strings. In such an array, during programming of a nearby memory device in a NAND string, in NAND-strings not to be programmed, if inversion regions are allowed to be formed in the semiconductor layer, or if the semiconductor layer is allowed to electrically float, electrical interaction exists between the access devices and the memory devices to inhibit programming of the memory devices.

11 Claims, 15 Drawing Sheets

DUAL-GATE DEVICE AND METHOD

CROSS REFERENCE TO RELATED APPLICATIONS

The present application is a division of U.S. patent application Ser. No. 11/197,462 filed on Aug. 3, 2005, which is incorporated herein by reference.

BACKGROUND OF THE INVENTION

1. Field of the Invention

The present invention relates to a semiconductor device. In particular, it relates to a semiconductor device having dual gate electrodes.

2. Discussion of the Related Art

Dual-gate semiconductor devices have been used as non-volatile memory devices. For example, K. Yanagidaira et al ("Yanagidaira's paper"), IEEE Electron Device Letters, vol. 26, pp. 473-475, July 2005, report a dual-gate silicon nanocrystal memory where electric charge stored on one side of the dual-gate device would strongly affect the threshold voltage of the device on the other side of the dual-gate device. Dual-gate semiconductor devices have also been used in NAND-type semiconductor non-volatile memory ("flash memory") cells. For example, U.S. Pat. No. 6,054,734 to Aozasa et al. (the '734 Patent), entitled "Non-volatile Memory Cell Having Dual-gate Electrodes," filed on Nov. 5, 1997 and issued on Apr. 25, 2000, discloses that a dual-gate approach allows reduced read disturb and better control over threshold voltage distributions in the programmed and erased states as the minimum feature size shrinks.

FIG. 1 reproduces FIG. 4 of the '734 Patent, which illustrates a dual-gate semiconductor device in a memory cell of the prior art. As shown in FIG. 1, region 24 is a supporting substrate (e.g., a silicon wafer), region 26 is an insulating layer separating the dual-gate device from the supporting substrate. Region 36 is a gate electrode of the first of two devices in the dual-gate device. Region 32 is the charge-storing gate dielectric layer of the first device. In one embodiment disclosed in the '734 Patent, dielectric region 32 is described as a composite layer consisting of a layer of silicon nitride sandwiched between two oxide layers. Such a composite layer (often referred to as "ONO") stores electric charge. Gate dielectric region 32 separates semiconductor channel region 30 from gate electrode region 36. The second gate electrode 38, which is the gate electrode for the second device, is separated from layer 30 by gate dielectric layer 34. Dielectric layer 34 does not store charge. Interconnecting layers 44 and 46 connect source and drain regions 40 and 42 to other circuitry.

As mentioned above, dual-gate memory cell 22 comprises a memory device having first gate electrode 36 and a non-memory device having second gate electrode 38. The memory device and the non-memory device are field effect devices. In a field effect device, when a voltage applied to a gate electrode is greater in magnitude than a "threshold" voltage (relative to a source electrode), a conducting channel forms between the source electrode and a drain electrode. By placing electric charge between the gate electrode and the channel, this threshold voltage can be changed as a function of the stored charge. In the dual-gate device of FIG. 1, electric charge trapped in gate dielectric 32 affects the threshold voltages of both the memory device and the non-memory device. Such an effect results from the very close electrical interaction between the memory device and the non-memory device. In particular, to calculate the thickness of channel region 30, the '734 Patent assumes that this semiconductor channel region is isotropic and monocrystalline. The amount of electric charge trapped in dielectric 32 is changed by programming and erasing operations effectuated by applying predetermined voltage levels on gate electrode 36 relative to the voltages in the source and drain regions 40 and 42.

FIG. 2 reproduces FIG. 17 of the '734 Patent, which illustrates dual-gate semiconductor memory cells in a NAND configuration. As shown in FIG. 2, non-volitile semiconductor memory device 202 comprises eight serially-connected dual-gate memory devices, each formed using the single dual-gate memory cell 22 of FIG. 1. Insulating layer 206 isolates the dual-gate memory devices, MN1 through to MN8, from supporting substrate 204. Each dual-gate memory device in FIG. 2 consists of first gate electrode 216, which is separated from channel region 210 by gate dielectric layer 212 formed as an ONO film. Each dual-gate device further comprises second gate electrode 218, which is separated from channel region 210 by gate dielectric layer 214. Similar to dielectric film 32 in dual-gate memory cell 22 of FIG. 1, gate dielectric layer 212 is the gate dielectric layer that stores electric charge. FIG. 2's NAND configuration illustrates that source and drain regions 220 and 222, which are self-aligned to the second gate electrodes 218 by ion implantation, are used between serially-connected adjoining dual-gate devices.

The '734 Patent teaches that the non-memory device in a dual-gate structure is used to read the presence or absence of charge in the corresponding memory device of the same dual-gate structure. For the non-memory device to detect the charge in the memory device, the thickness of channel region 210 (FIG. 2) is chosen to allow the electric field at one surface to influence the other surface. One method to achieve this effect is to allow one surface to be uniformly within the depletion region of the other surface, when a selected voltage is applied to the source electrode of the dual-gate device. Such a close electrical interaction means that the charge stored in gate dielectric 212 in FIG. 2 affects the threshold voltage of the non-memory device, which is measured by the voltage required to be applied to gate electrode 218 relative to either source electrode 220 or 222 to allow an electric current to flow through channel region 210.

The '734 Patent further teaches that the memory device of the dual-gate device is programmed by applying a predetermined voltage to memory gate electrodes 216 through other memory devices, while the non-memory devices play no part in this programming operation. The NAND non-volatile memory of FIG. 2 has several disadvantages associated with it.

First, the requirement that the charge stored in the gate dielectric of the memory device affect the threshold voltage of the associated non-memory device in the dual-gate device ensures that strong electrical interaction exists between these two devices. This approach is taken in both the '734 Patent and Yanagidaira's paper. Furthermore, using crystalline silicon in FIG. 2's channel region 210 ensures that this strong electrical interaction is uniform across the whole surface of each device's channel region. The method for reading a cell, as taught in the '734 Patent, requires a current to pass through the channel region near its surface adjacent to the non-memory devices in the NAND string. Using this current to determine the actual threshold voltage of the device being read is difficult, as such a determination depends on being able to discriminate a current from a base current level that is affected by the programmed and erased states of all other memory cells in the string. This method is made even more challenging by the small difference in threshold voltages between the programmed and the erased state of a device, due to the relatively great distance over which the stored electric charge must act to affect these threshold voltages.

The strong, uniform electrical interaction between the non-memory device and its associated memory device also results in read disturb in the memory cells in the NAND serial string every time a single cell is read. This read disturb results from a change in the stored charge in each memory cell as a result of applying the read voltages to all non-memory gate electrodes of the NAND string.

A further disadvantage of the structure taught in '734 Patent stems from the requirement that the memory device is programmed through other memory devices in the NAND string. Because of this requirement, each gate electrode of the memory devices between the bit line contact (e.g., bit line contact 224 in FIG. 2) and the selected memory device (i.e., the memory device to be programmed) must have a large applied voltage relative to the bit line contact voltage to ensure good electrical connection between the bit line contact and the inverted channel of the selected memory device. This "program pass voltage" is lower than the program voltage applied to the gate electrode of the selected memory device, but the program pass voltage can still lead to a serious program disturb sufficient, after repetitive application, to change the amount of electric charge in the unselected memory devices.

Yet a further disadvantage of the structure in the '734 Patent stems from forming peripheral circuits (e.g., sense amplifiers, word lines, and bit lines) in the same silicon material as the channel region in the dual-gate devices, which limits the areal density of such a memory integrated circuit.

A further disadvantage of the dual-gate structure of the '734 Patent stems from using monocrystalline silicon to form the channel region (e.g., channel 210 of FIG. 2). Monocrystalline silicon formation is an expensive method step, which practically excludes any three dimensional stacking of such circuitry, thereby limiting the areal density of such a memory integrated circuit.

SUMMARY OF THE INVENTION

The present invention provides a non-volatile semiconductor memory device using a dual-gate structure that can be used to build a memory circuit of high density, while avoiding charge disturbs during programming and reading operations.

According to one embodiment of the present invention, a dual-gate memory device is formed over and insulated from a semiconductor substrate that may include additional functional circuits interconnected to the dual-gate memory device. The dual-gate device comprises two semiconductor devices formed on opposite surfaces of a common active semiconductor region. In one embodiment, under a first condition, the two devices in the dual-gate structure can be sufficiently electrically isolated from each other within a predetermined range of operational voltages applied to the gate electrodes and the source and drain regions of the dual-gate device. Further, under another condition, the devices on opposite surfaces of the common active semiconductor region can electrically interact strongly with each other within a predetermined range of operational voltages applied to the gate electrodes and source and drain regions. In one embodiment of the present invention, the memory device in the dual-gate structure includes a gate dielectric comprising a composite layer of silicon oxide, silicon nitride and silicon oxide (ONO). Such a dual-gate memory device is a suitable building block in a NAND-type non-volatile memory array.

According to one embodiment of the present invention, the active semiconductor layer comprises a polycrystalline semiconductor material, such as polycrystalline silicon ("polysilicon"), polycrystalline germanium or a combination of polysilicon and polycrystalline germanium. The polycrystalline semiconductor material may be obtained by deposition, or by crystallizing an amorphous semiconductor material using laser irradiation or heat treatment, for example.

The present invention provides a dual-gate device comprising a first gate electrode, a first dielectric layer formed over the first gate electrode, a semiconductor layer formed over the first dielectric layer, a second dielectric layer formed over the semiconductor layer, and a second gate electrode formed over the second dielectric layer. In that dual-gate device, a predetermined range of electric charge can be stored either between the first gate electrode and the semiconductor layer, or between the second gate electrode and the semiconductor layer, to affect the threshold voltage of only one of the devices in the dual-gate device.

Preferably, the dual-gate device is separated from a substrate by an insulating layer. The substrate may contain circuitry that may be interconnected with the dual-gate device.

Preferably, one gate dielectric layer in the two devices of the dual-gate device stores electric charge, so as to form a dual-gate memory device. The gate dielectric layer may be formed as a composite dielectric stack comprising silicon oxide, silicon nitride and silicon oxide (ONO). Other dielectric layers may also be used, such as embedding a floating conductor within the gate dielectric layer. Such a floating conductor may be placed between the memory device's gate electrode and the active semiconductor layer, and may consist of nanocrystals of a conductor or semiconductor embedded in the gate dielectric layer.

According to one embodiment of the present invention, a dual-gate device has an active semiconductor layer comprising a polycrystalline semiconductor material, which contains grains of semiconductor material. Each grain may consist of an internal region, which is crystalline (often with many internal crystal defects), and an external grain boundary characterized by a structure similar to an amorphous semiconductor. In the active semiconductor region, the channel region of one of the devices of the dual-gate structure may contain one or more grain boundaries. This grain boundary shields the device from any depletion region that may form from the opposite device. Such depletion regions may extend through the grains from one device of the dual-gate device to the other device, but the grain boundaries provide electrical shielding within the operational voltages of the dual-gate device. Such a device may be used as a memory device.

According to one embodiment of the present invention, multiple dual-gate memory devices may share the same active semiconductor region, and may be serially connected in a NAND string. Within each dual-gate device, one device is a memory device having a gate dielectric optimized to store electric charge. The other device, on the opposite face of the active semiconductor layer, is used as an access device. According to one embodiment of the present invention, the memory device is programmed by applying a programming voltage to the gate electrode, while gate electrodes of the other memory devices in the same NAND string either are left electrically floating or are applied a small voltage. While the programming voltage is applied to the gate electrode of the memory device, a smaller "program pass voltage" is applied to all the gate electrodes of the access devices that are situated between the memory device being programmed and the grounded bit line contact of the NAND string. The program pass voltage is the highest operational voltage applied to the gate electrode of an access device. In the operation of this NAND-type memory device, the electrical interaction between the access device and the memory device is minimized when the voltage applied to the gate electrode of the access device is at or lower than the program pass voltage, while one of the memory devices in the NAND string is programmed. Electrical interaction is minimized when all source and drain regions in the active semiconductor layer between the bit line contact and the memory device being programmed are connected electrically to the bit line contact through access device inversion channels, with the bit line contact being held close to the ground potential.

For NAND strings adjacent to and sharing the same memory gate electrode word lines and access gate electrode word lines with a NAND string that is being programmed, strong electrical interaction in the active semiconductor layer between the access devices and the memory devices is needed, so as to ensure disturbances of the stored electric charge in these NAND strings not being programmed are minimized during the programming operation in the neighboring NAND string. Disturbances are minimized when all sources and drains within the active semiconductor layer of these NAND strings inhibited from being programmed are allowed to electrically float. The source/drain region connected directly to the bit line contact may also be allowed to float.

When a memory cell in a NAND string of the present invention is read, a "read pass voltage" is applied to the access gate electrodes, while the memory gate electrodes are left floating or are applied a low voltage, except for the memory device being read. The gate electrode of the memory device being read is applied a read voltage, which is usually lower than the read pass voltage, while its associated access device is non-conducting.

Thus, program and read disturbs of stored electric charge are both minimized, in accordance with the present invention.

The present invention will be better understood from the detailed description below with reference to the drawings.

DETAILED DESCRIPTION OF THE PREFERRED EMBODIMENTS

The present invention provides a dual-gate semiconductor memory device that is suitable for use in three-dimensionally stacked memory circuits to achieve high circuit density. Additionally, when used in a NAND-type non-volatile semiconductor memory device, a memory device of the present invention experiences only minor disturbs of stored electric charge during programming and reading.

FIGS. 3A-3L illustrate a method suitable for forming a NAND-type non-volatile semiconductor memory device, according to one embodiment of the present invention.

Figure 1:
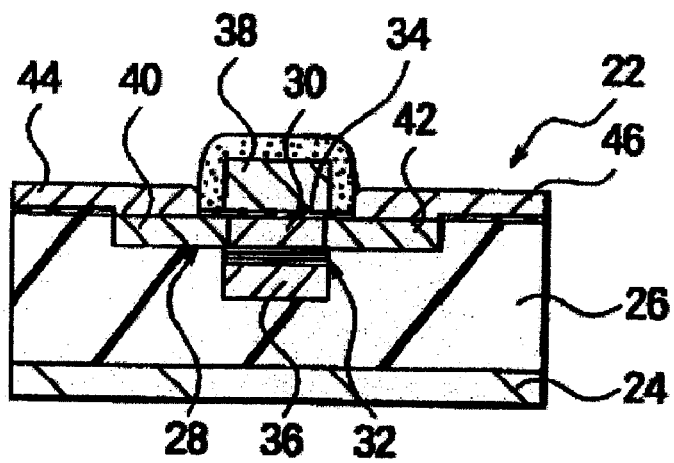
FIG. 1 shows dual-gate memory cell 22 of the prior art.
Figure 2:
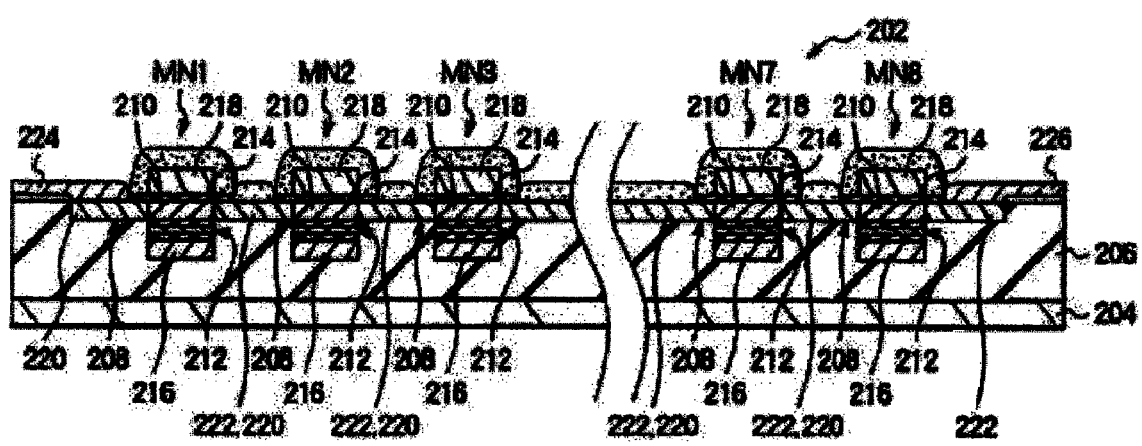
FIG. 2 shows dual-gate NAND string 202 of the prior art.
Figure 3A:
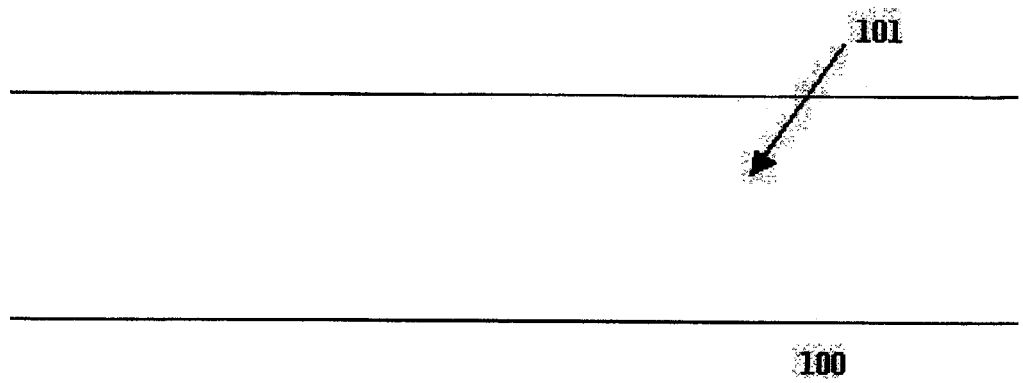
FIGS. 3A-3L show a method applicable to forming a NAND-type non-volatile memory device, according to one embodiment of the present invention.

FIG. 3A shows insulating layer 101 provided on substrate 100. Substrate 100 may be a semiconductor wafer containing integrated circuitry for controlling a non-volatile memory. The semiconductor wafer may be either of a bulk type, where the substrate is made of a single crystal of semiconductor, such as silicon, or of a semiconductor-on-insulator type, such as silicon on insulator (SOI), where the integrated circuitry is made in the thin top silicon layer. Insulating layer may be planarized using conventional chemical mechanical polishing (CMP). Within insulating layer 101 may be embedded vertical interconnections (not shown in FIG. 3) for connecting the integrated circuitry with the non-volatile memory device. Such interconnections may be made using conventional photolithographic and etch techniques to create contact holes, followed by filling the contact holes with a suitable type of conductor, such as a combination of titanium nitride (TiN) and tungsten (W), or a heavily doped polysilicon.

Figure 3B:
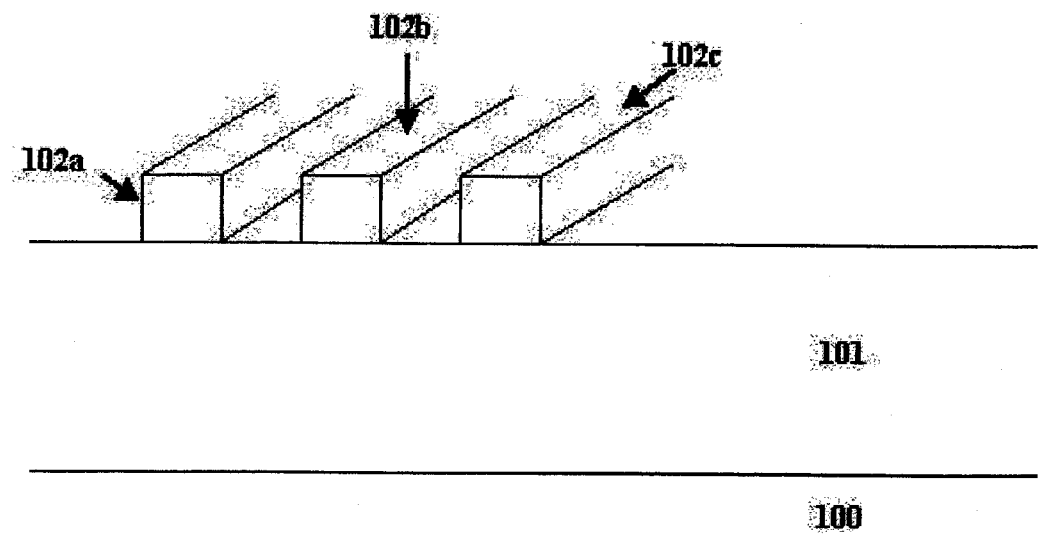

Next, a conducting material 102 is provided on top of insulating layer 101 using conventional deposition techniques. Material 102 may also comprise a stack of two or more conducting materials formed in succession. Suitable materials for material 102 include heavily doped polysilicon, titanium disilicide ($TiSi_2$), tungsten (W), tungsten nitride (WN), cobalt silicide ($CoSi_2$), nickel silicide (NiSi) or combinations of these materials. Conventional photolithographic and etch techniques are used to pattern gate electrode word lines 102a, 102b and 102c, as shown in FIG. 3B. These word lines form the gate electrode word lines for the access devices to be formed, according to one embodiment of the present invention.

Figure 3C:
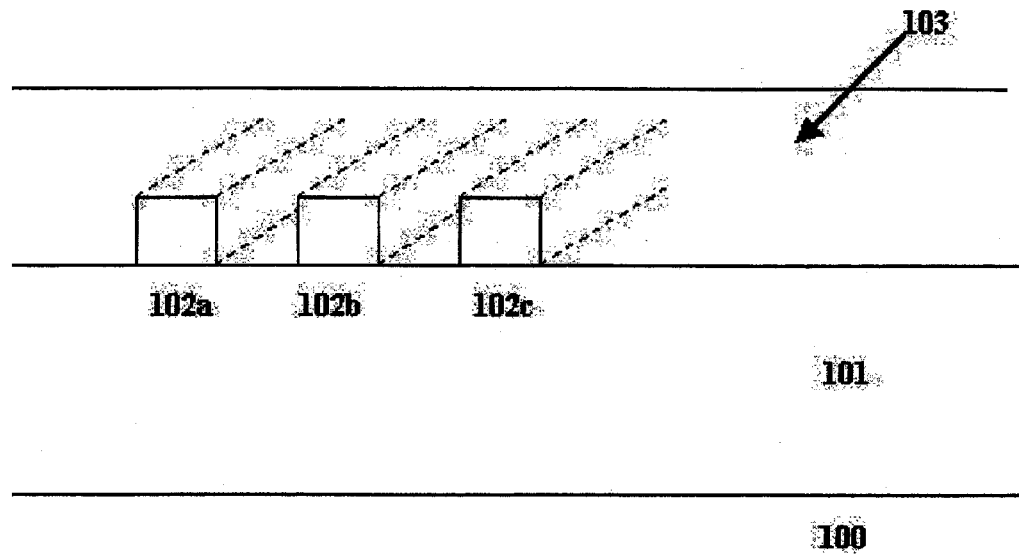

Next, an insulating layer 103 is provided over word lines 102a, 102b and 102c. Insulating layer 103 may be provided using high density plasma (HDP), chemical vapor deposition (CVD), plasma enhanced CVD (PECVD), physical vapor deposition (PVD) or may be a spin on glass (SOG). The surface is then planarized using a conventional CMP step, which either may polish insulating layer 103 down to the surface of the word lines 102a, 102b and 102c, or timed such that a controlled thickness remains of insulating layer 103 between the surface of the word lines 102a, 102b and 102c and the top polished surface of insulating layer 103. In the former case, after CMP, a controlled thickness of an insulating material is deposited using one of the techniques discussed above. Under either approach, the result is shown in FIG. 3C.

Figure 3D:
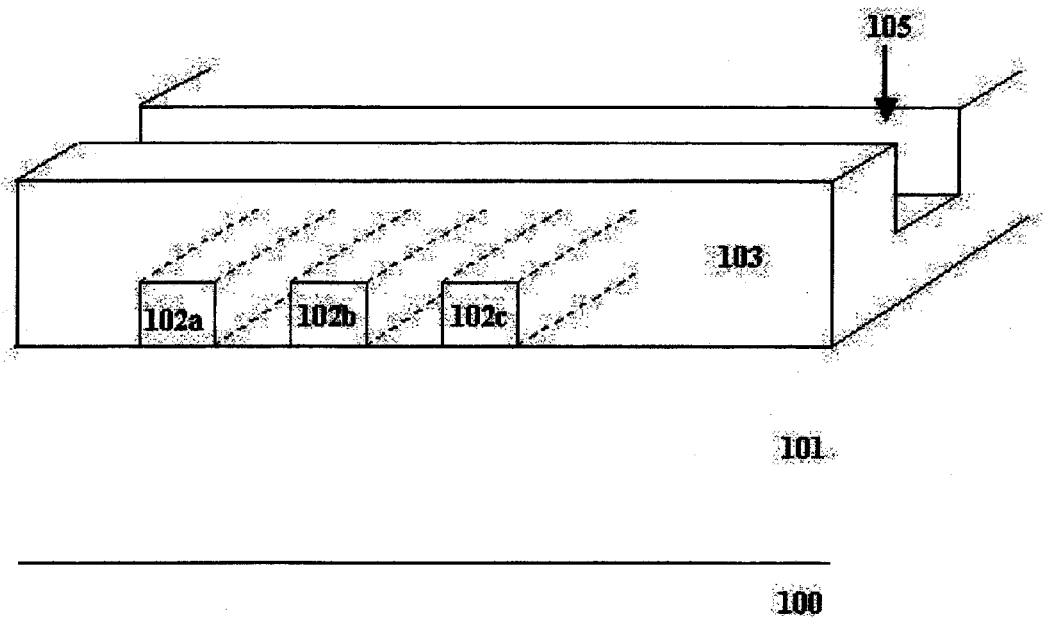
Figure 3E:
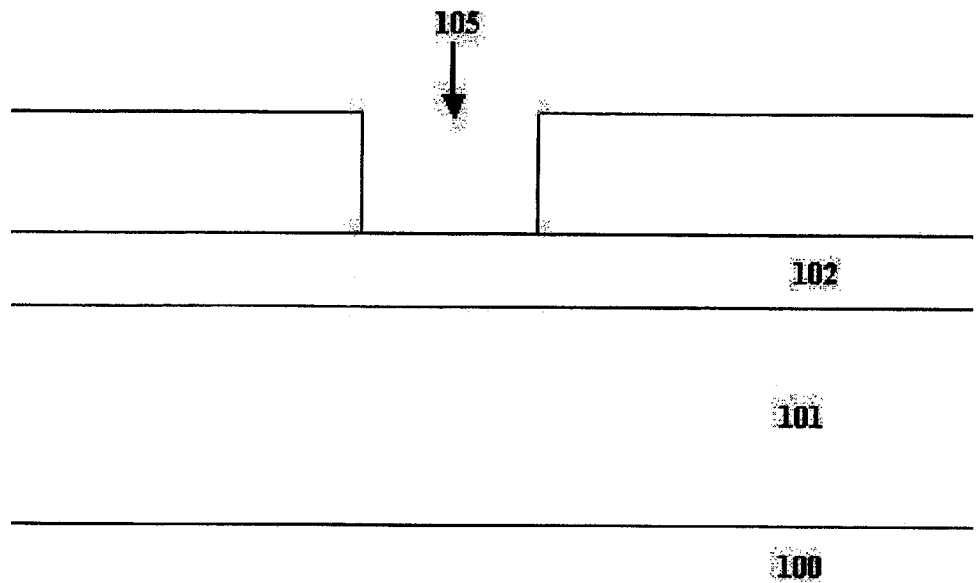

Next, trenches 105 are etched into insulating layer 103 using conventional photolithographic and etch techniques. The etching exposes at least the surface of the word lines 102a, 102b and 102c and removes a portion of insulating layer 103. Over-etching may also take place, so long as no detriment is made to the electrical working of the eventual completed structure. FIG. 3D shows trench 105 after formation. The trenches are formed in a direction perpendicular to word lines 102a, 102b and 102c. FIG. 3E shows a cross section through both trench 105 and word line 102, which runs along the plane of FIG. 3E. Trench 105 may be 50 Å to 3000 Å thick, preferably about 500 Å. Trenches 105 may be formed in a trench etch which also removes a portion of each word line 102. Such an etch may be achieved by over-etching (using plasma etching, for example) of insulating material 105 into a portion of word lines 102. Thus, the bottom of trench 105 may be situated below the top surface of each word line 102.

Next, thin dielectric layer 106 is formed on top of the structure shown in FIG. 3E. Thin dielectric layer 106 forms the gate dielectric of the access device and may be formed using a conventional method, such as thermal oxidation in an oxidizing ambient, low pressure CVD (LPCVD) deposition of a dielectric material, such as silicon dioxide, silicon nitride, silicon oxynitride, high temperature oxide (HTO), PECVD dielectric (e.g., silicon oxide or silicon nitride), atomic layer deposition (ALD) of silicon oxide, or some high-k dielectric material. The effective oxide thickness may be in the range of 10 Å and 400 Å.

Figure 3F:
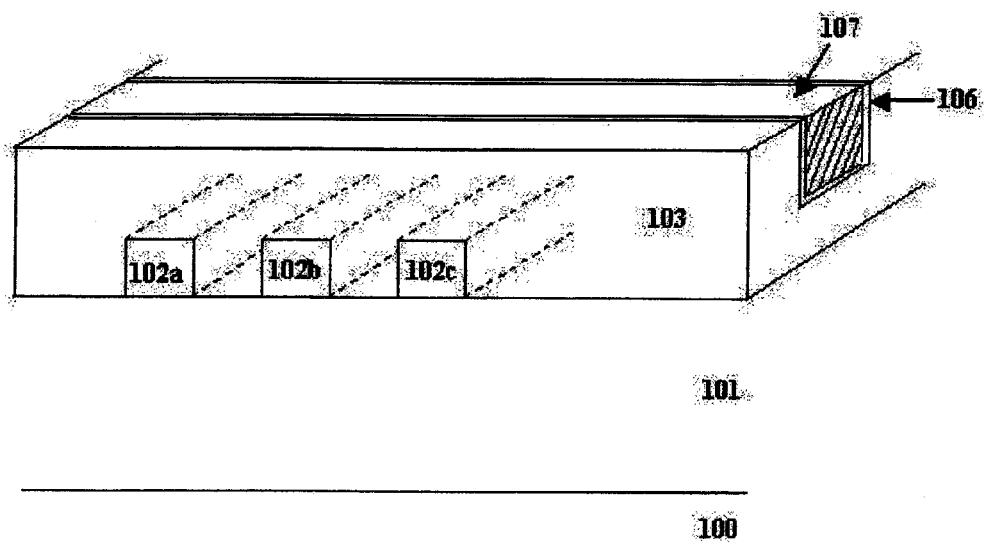

Next, active semiconductor layer 107 is formed by depositing a semiconductor material, such as polycrystalline silicon (polysilicon), polycrystalline germanium, amorphous silicon, amorphous germanium or a combination of silicon and germanium, using conventional techniques such as LPCVD or PECVD. Polycrystalline material may be deposited as a first step as an amorphous material. The amorphous material may then be crystallized using heat treatment or laser irradiation. The material is formed sufficiently thick, so as to completely fill trench 105 (e.g., at least half the width of trench 105). After deposition, the part of the semiconductor material above trench 105 is removed using, for example, either CMP, or plasma etching. Using either technique, the semiconductor material can be removed with very high selectivity relative to insulating layer 103. For example, CMP of polysilicon can be achieved with selectivity with respect to silicon oxide of several hundred to one. The representative result using either technique is shown in FIG. 3F.

Figure 3G:
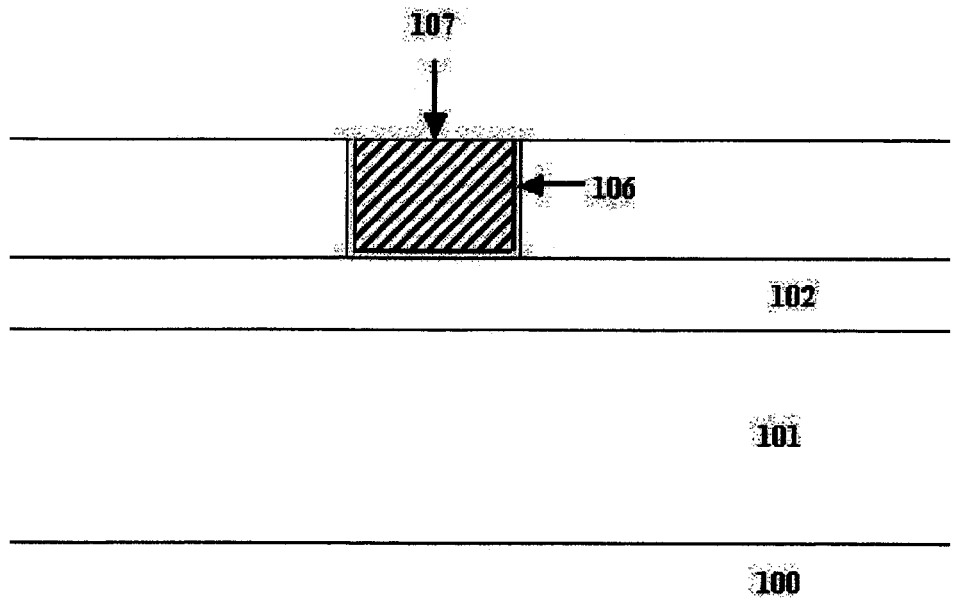

FIG. 3G shows a cross section made through trench 105 and word line 102. Word line 102 runs in a direction parallel to the cross section plane of FIG. 3G. Thin dielectric layer 106 forms the gate dielectric layer of the access device and material 107 is the semiconductor material remaining in trench 105 after the material is substantially removed from the surface of insulating layer 103. Material 107 forms the active semiconductor layer for both the memory device and the access device of the dual-gate device. Material 107 may be undoped or may be doped using conventional methods, such as ion implantation, or in-situ doping carried out in conjunction with material deposition. A suitable doping concentration is between zero (i.e., undoped) and $5\times10^{18}/cm^3$, and may be p-type for an NMOS implementation or n-type for a PMOS implementation.

Figure 3H:
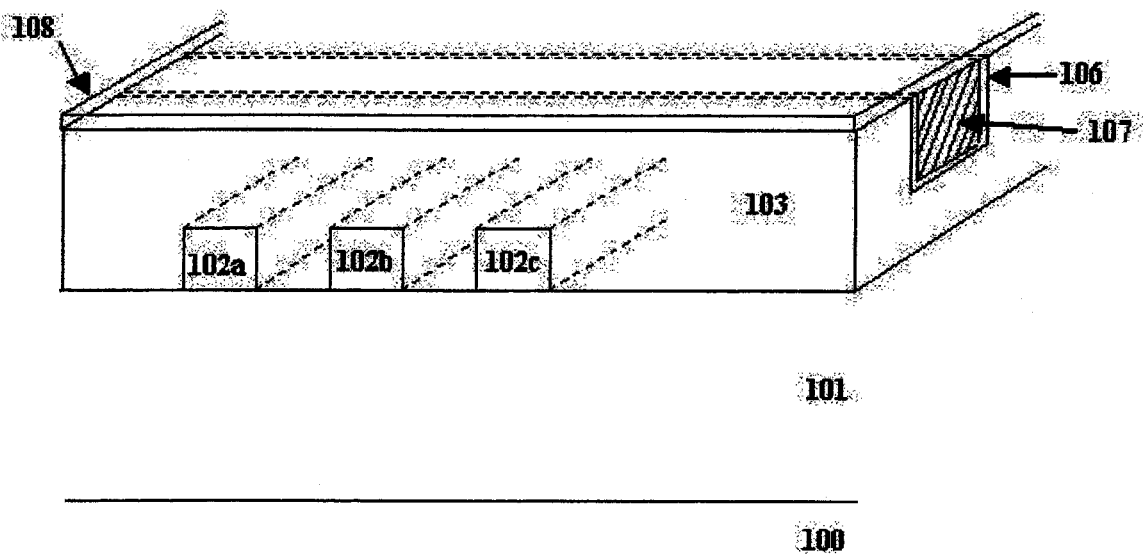

Next, dielectric layer 108 is provided, as shown in FIG. 3H. Dielectric layer 108, which is the dielectric layer for the memory device in the dual-gate device, may be a composite ONO layer consisting of a bottom 10Å to 80Å thick thin silicon oxide, an intermediate 20 Å to 200 Å silicon nitride layer, and a top 20 Å to 100 Å silicon oxide layer. (Other materials may take the place of the silicon nitride layer, such as silicon oxynitride, silicon-rich silicon nitride, or a silicon nitride layer that has spatial variations in silicon and oxygen content.) Conventional techniques may be used to form these layers. The bottom thin silicon oxide layer may be formed using thermal oxidation in an oxidizing ambient, low pressure oxidation in a steam ambient, or LPCVD techniques that deposits a thin layer of silicon oxide, such as high temperature oxide (HTO). Atomic layer deposition (ALD) may also be used to form the bottom thin silicon oxide layer. The intermediate layer may be formed using LPCVD techniques or PECVD techniques. The top silicon oxide layer may be formed using, for example, LPCVD techniques, such as HTO, or by depositing a thin amorphous silicon layer, followed by a silicon oxidation in an oxidizing ambient.

Alternatively, dielectric layer 108 may be a composite layer consisting of silicon oxide, silicon nitride, silicon oxide, silicon nitride and silicon oxide (ONONO), using the techniques discussed above. As discussed above, the silicon nitride may be replaced by silicon oxynitride, silicon-rich silicon nitride, or a silicon nitride layer that has spatial variations in silicon and oxygen content. Alternatively, an ONONONO layer may be used. Such multiplayer composites may be tailored such that the electric charge stored within dielectric layer 108 persists for longer periods.

Alternatively, dielectric layer 108 may contain a floating gate conductor for charge storage that is electrically isolated from both the gate electrode of the memory device to be formed and the active semiconductor layer. The floating gate conductor may comprise nano-crystals that are placed between the gate electrode and the active semiconductor layer 107. Suitable conductors may be silicon, germanium, tungsten, or tungsten nitride.

Alternatively to charge storage in dielectric layer 108, the threshold voltage shifts may also be achieved by embedding a ferroelectric material whose electric polarization vector can be aligned to a predetermined direction by applying a suitable electric field.

Figure 3I:
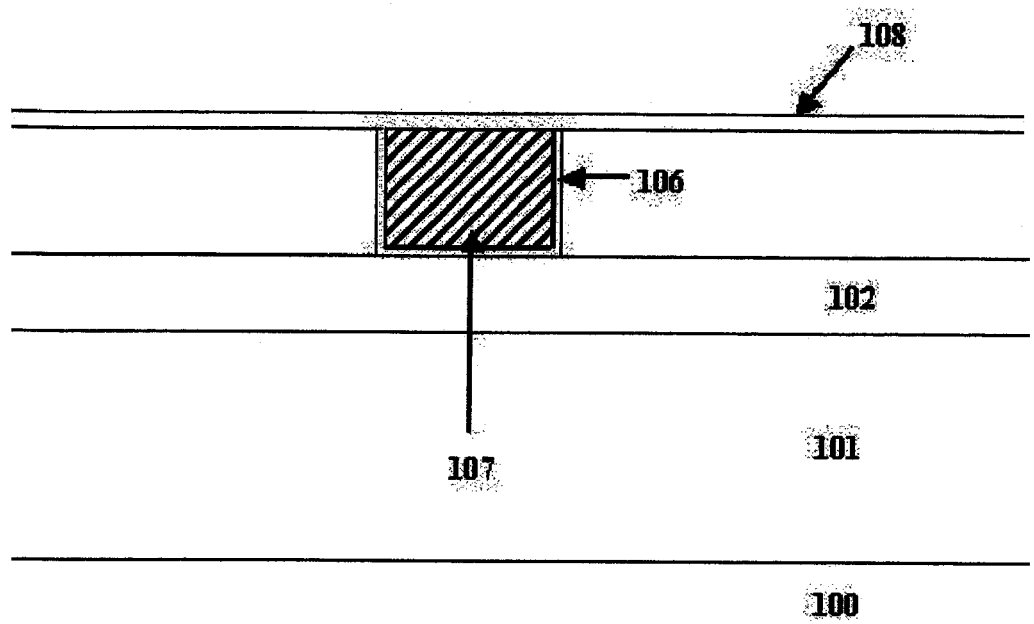

FIG. 3I shows a cross section of the forming dual-gate structure through word line 102, after the step forming dielectric layer 108.

Figure 3J:
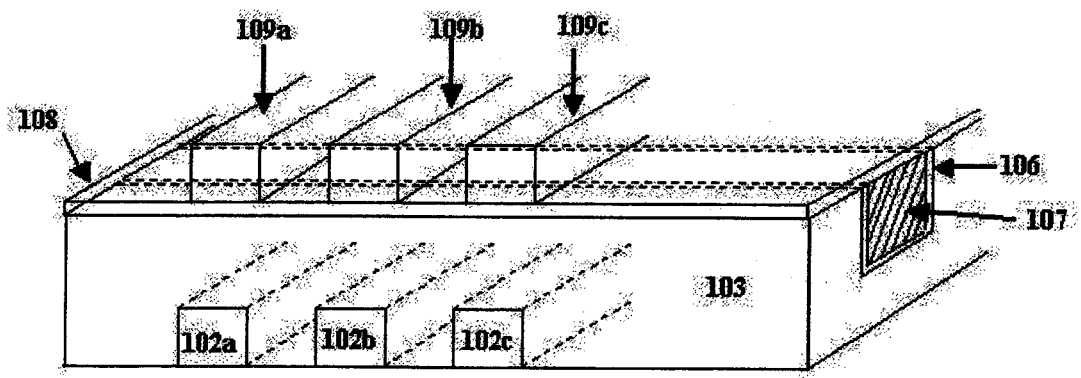
Figure 3K:
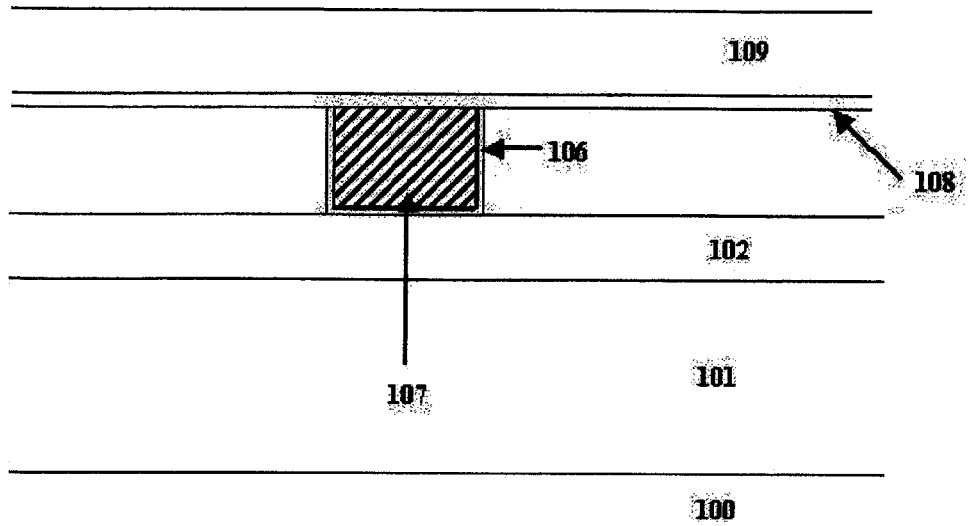

Next, conducting material 109 is provided over dielectric layer 108 using conventional deposition techniques. Conducting material 109 may comprise a stack of two or more conducting materials. Suitable materials for conducting material 109 include heavily doped polysilicon, titanium disilicide ($TiSi_2$), tungsten (W), tungsten nitride (WN), cobalt silicide ($CoSi_2$), nickel silicide (NiSi) or combinations of these materials. Conventional photolithographic and etch techniques are used to form gate electrode word lines 109a, 109b and 109c, as is shown in FIG. 3J. These word lines form the gate electrode word lines of the forming memory devices, and run substantially parallel to the underlying access gate electrode word lines 102a, 102b and 102c. FIG. 3K shows a cross section through word lines 102 and 109, after the step forming word lines 109a, 109b and 109c.

Figure 3L:
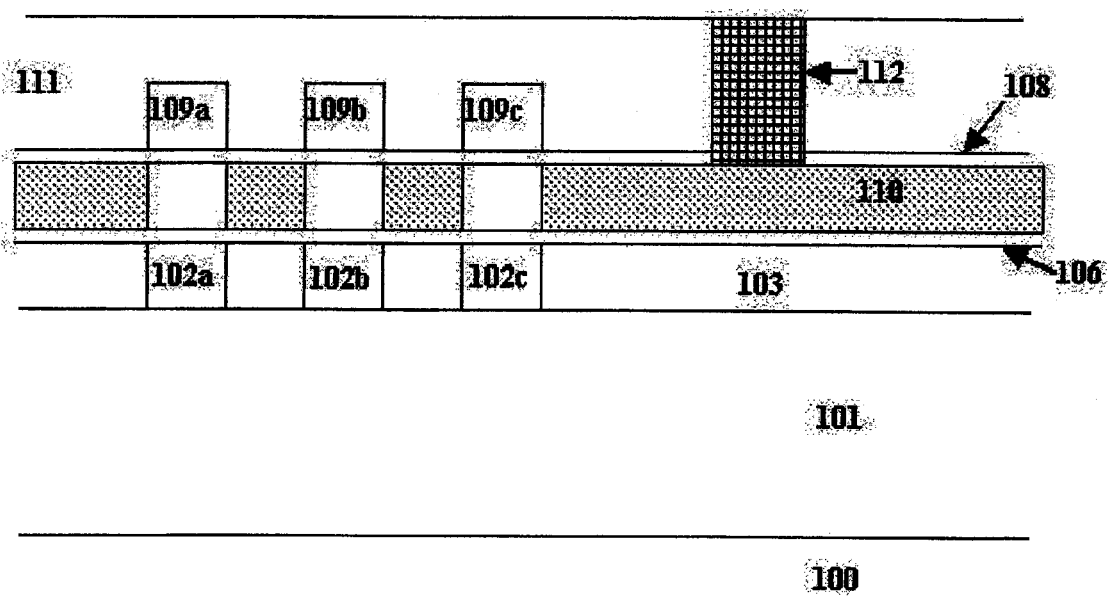

Next, source and drain regions are formed within active semiconductor layer 107 using conventional methods such as ion implantation. For an NMOS implementation, n-type ions may be implanted with a dose between $1\times10^{14}/cm^2$ and $1\times10^{16}/cm^2$, using ionic species such as arsenic, phosphorus or antimony. For a PMOS implementation, p-type ions may be implanted at substantially the same dose range. P-type ionic species may include boron, boron difluoride, gallium or indium. The ion implantation provides source and drain regions that are self-aligned to the gate electrode word lines 109a, 109b and 109c. The result is illustrated in FIG. 3L in which regions 110 represent the heavily doped source and drain regions. In one embodiment, these source and drain regions extend from the top surface of active semiconductor layer 107 to its bottom surface. The source and drain regions may be formed using a combination of ion implantation and subsequent thermal steps to diffuse the dopant atoms introduced.

Next, insulating layer 111 may be provided using high density plasma (HDP), CVD, PECVD, PVD or a spin on glass (SOG). The surface may then be planarized using a conventional CMP step. The result is shown in FIG. 3L.

Vertical interconnections 112 may then be formed using conventional photolithographic and plasma etching techniques to form small holes down to gate electrodes 109a, 109b 109c, heavily doped semiconductor active regions 110 and gate electrodes 102a, 102b and 102c. The resulting holes are filled with a conductor using conventional methods, such as tungsten deposition (after an adhesion layer of titanium nitride has been formed) and CMP, or heavily doped polysilicon, followed by plasma etch back or CMP. The result is shown in FIG. 3L.

Subsequent methoding may be carried out to further interconnect the dual-gate devices with other dual-gate devices in the same layer or in different layers and with the circuitry formed in the substrate 100.

Although FIG. 3 illustrates a method which forms the access device (i.e., the non-memory device) before forming the memory device, by making dielectric layer 108 charge-storing and dielectric layer 106 non-charge storing, the memory device may be formed before the non-memory device. Irrespective of which order is chosen, the operations of the memory device and non-memory device are substantially the same.

FIG. 3 therefore illustrates forming a dual-gate memory device with access gate 102, access gate dielectric 106, semiconductor active region 107, memory dielectric 108, memory gate electrode 109 and source and drain regions 110.

Figure 4A:
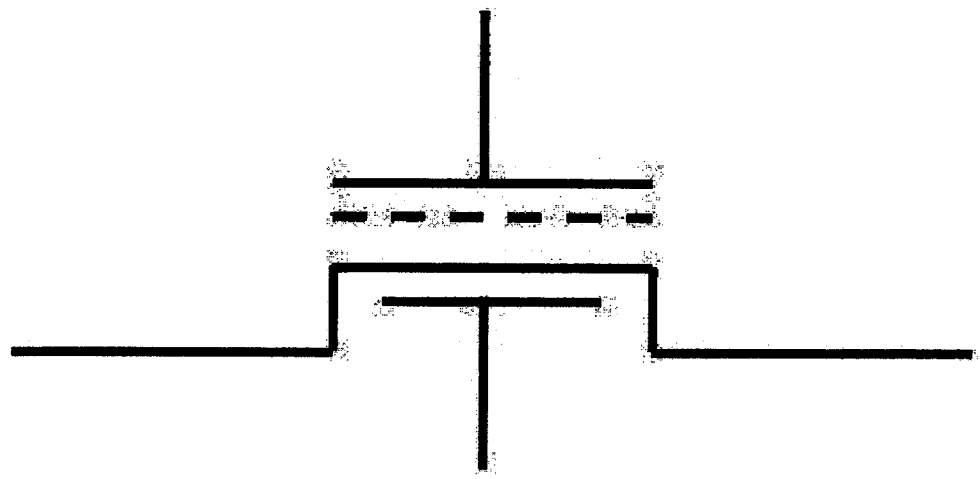
FIG. 4A shows a symbol representing a dual-gate memory cell of the present invention.
Figure 4B:
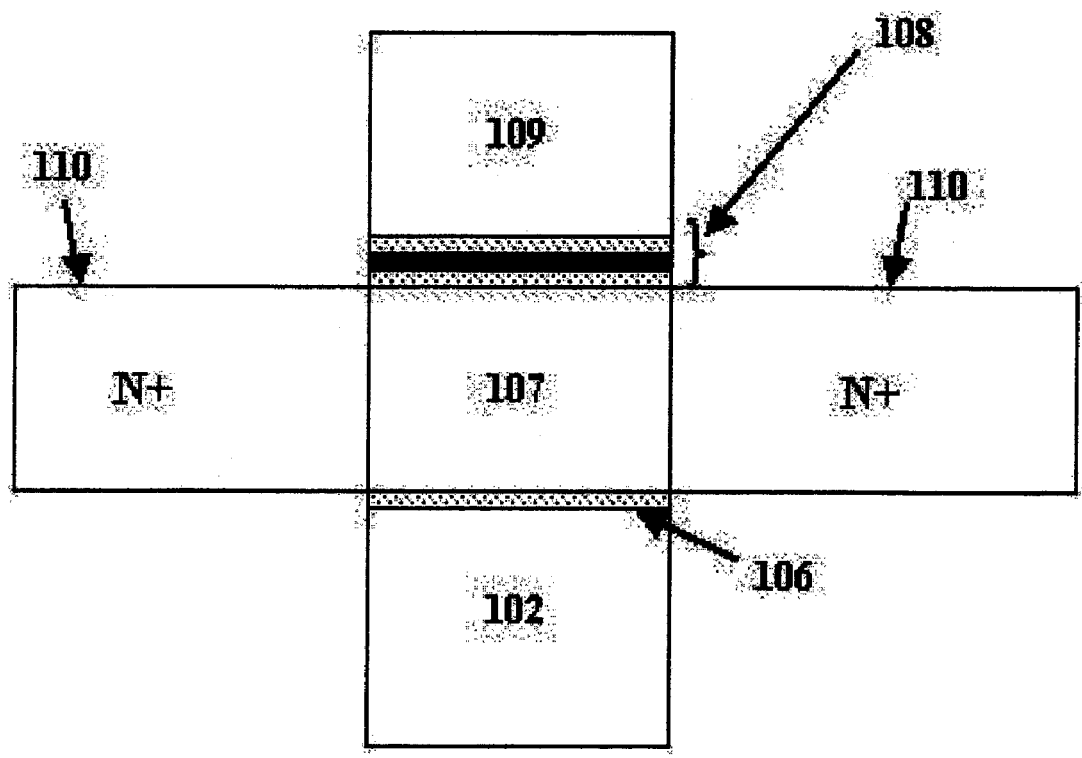
FIG. 4B shows a structural schematic representation of a dual-gate memory cell of the present invention.

FIG. 4A shows an electric schematic symbol for this dual-gate device. FIG. 4B shows a structural schematic representation of a dual-gate memory cell implemented using a NMOS method, according to one embodiment of the present invention.

Figure 5A:
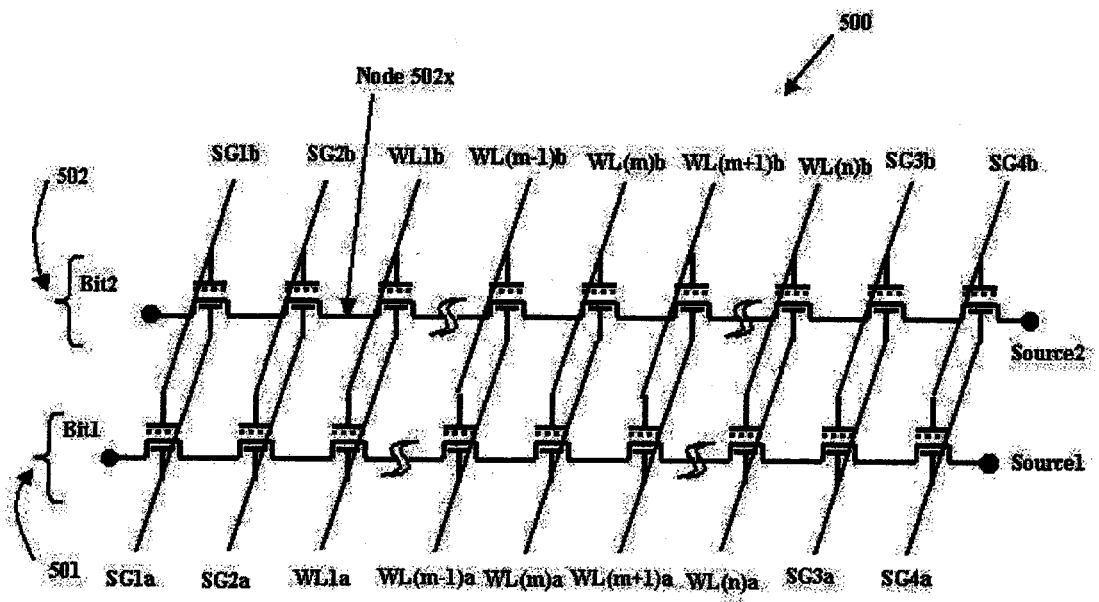
FIG. 5A is a circuit diagram showing two NAND strings, each comprising a number of dual-gate memory cells, according to one embodiment of the present invention.

FIG. 5A shows NAND strings 501 and 502, using the electric circuit symbol of FIG. 4A for each dual-gate device. As shown in FIG. 5A, NAND strings 501 and 502 are each formed by a number of dual-gate memory cells, with corresponding dual-gate memory cells from NAND strings 501 and 502 sharing the same access gate electrode word lines and memory gate electrode word lines. NAND strings sharing word lines may be placed adjacent to each other, or may be separated from each other by one or more parallel NAND strings in between. Each NAND string may have one or more select dual-gate devices (e.g., the devices controlled by word lines SG1b and SG2b) in the NAND string between the bit line contact and the dual-gate memory cells, and one or more select dual-gate devices (e.g., the devices controlled by word lines SG3b and SG4b) between the source contact and the dual-gate memory cells.

Figure 5B:
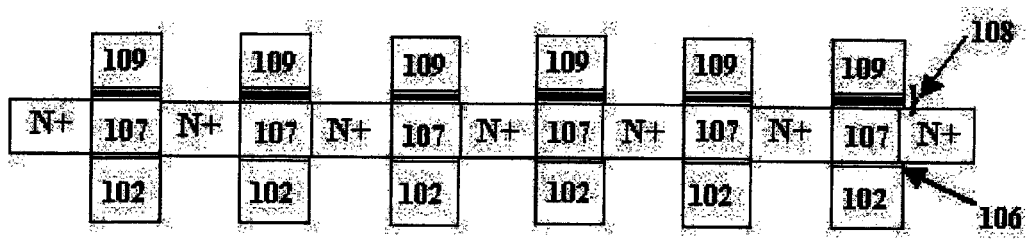
FIG. 5B shows a structural schematic representation of part of a NAND string according to one embodiment of the present invention.
Figure 5C:
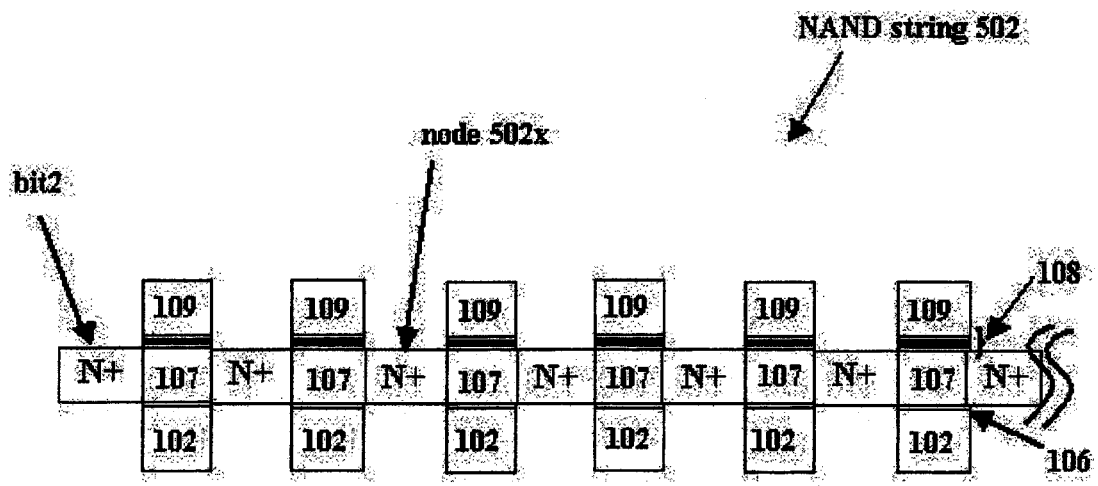
FIG. 5C shows a structural schematic representation of a part of the NAND string from FIG. 5A, illustrating a strong electrical interaction between the memory device and the access devices, provided to inhibit programming.

FIG. 5B shows a structural schematic representation of one part of a NAND string, according to one embodiment of the present invention. FIG. 5C illustrates NAND string 502 being inhibited from programming, when another NAND string which shares with it the same gate electrode word lines is being programmed. Electrical operations of these NAND strings for programming, reading and erasing are described below, so as to explain the electrical interaction required between the access devices and the memory devices in each NAND string.

Figure 8:
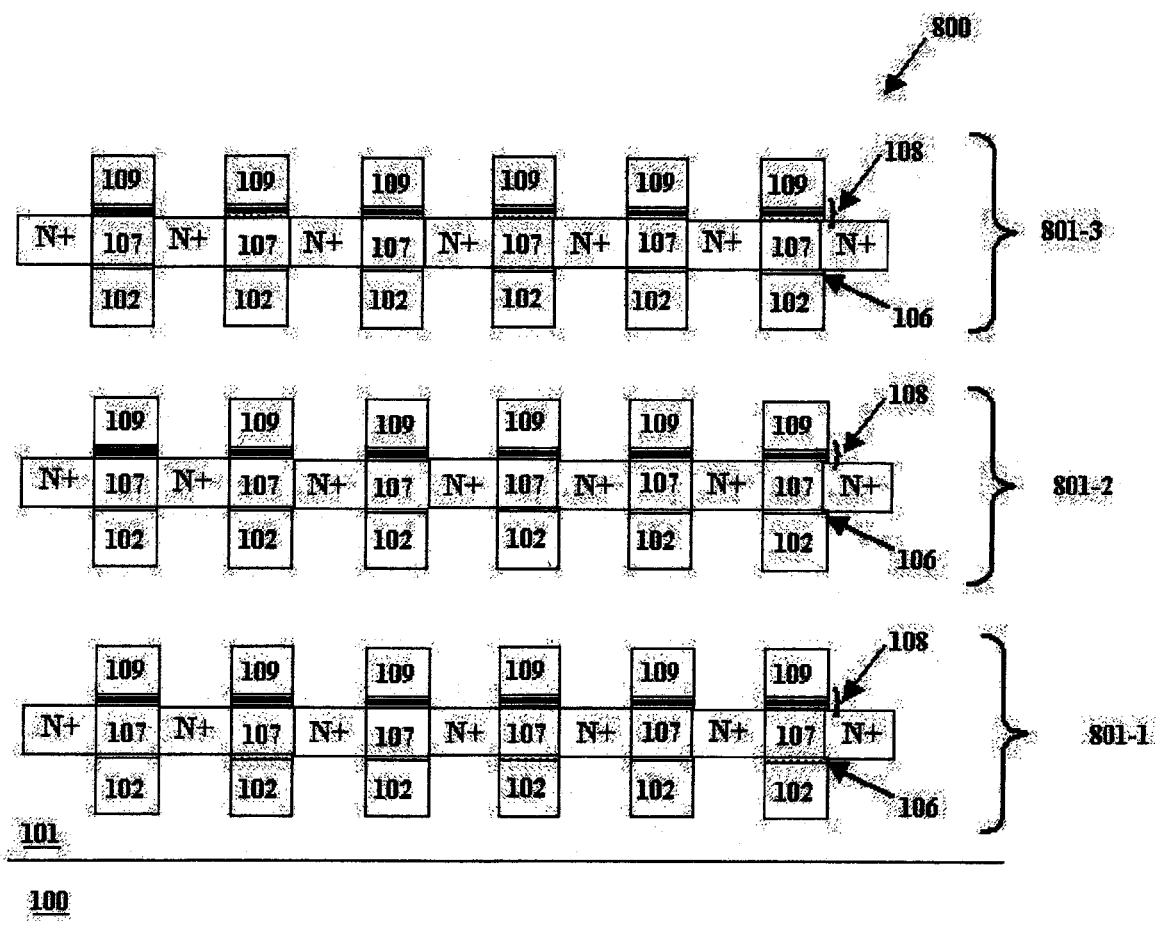
FIG. 8 shows structure 800, which is formed by stacking dual-gate NAND-type non-volatile memory devices; the stacking is achieved by applying the methoding steps shown in FIGS. 3A-3L repetitively, according to one embodiment of the present invention.

FIG. 8 shows structure 800, which includes multiple layers of dual-gate memory cells, formed using the method steps discussed above in conjunction with FIG. 3. As shown in FIG. 8, layers 801-1, 801-2 and 801-3 may be each formed using the methoding sequence illustrated by FIG. 3.

Figure 9:
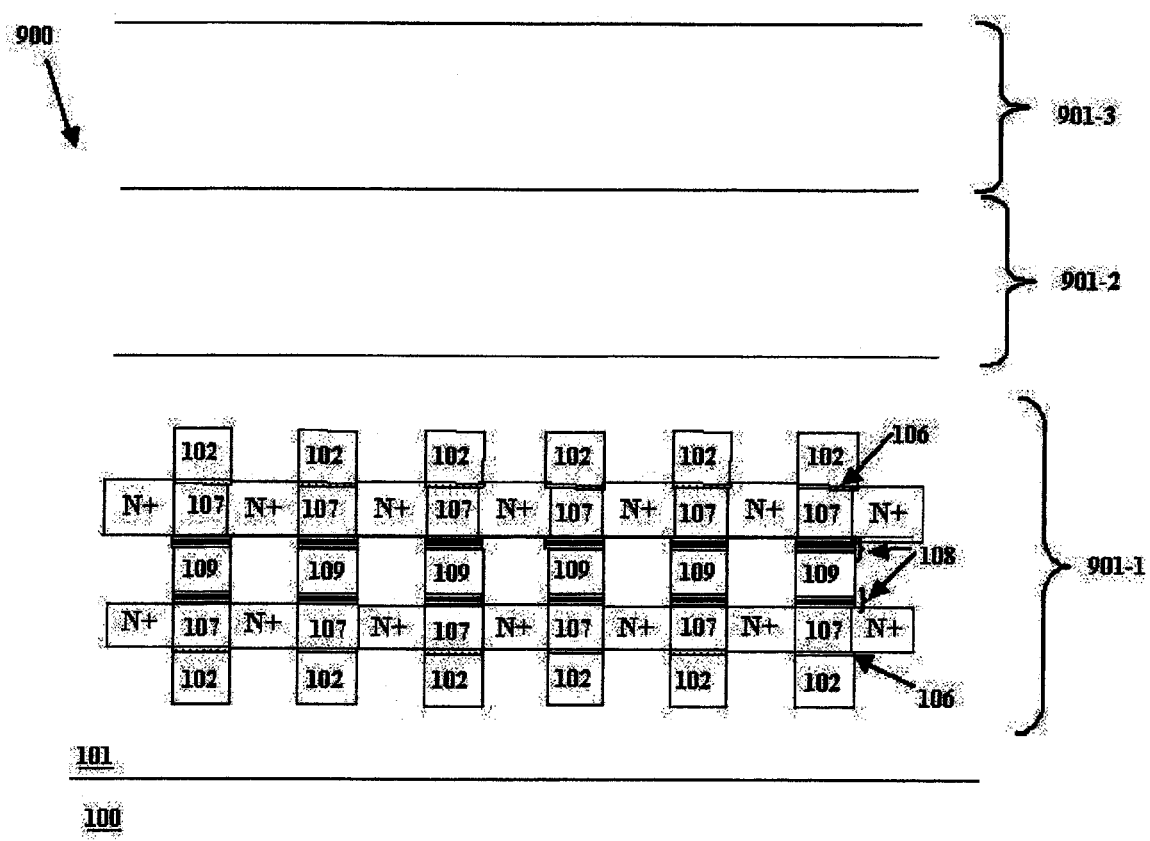
FIG. 9 shows structure 900, which is also formed by stacking dual-gate NAND-type non-volatile memory devices, according to one embodiment of the present invention; in structure 900, each memory gate electrode has two gate dielectric layers.
Figure 10:
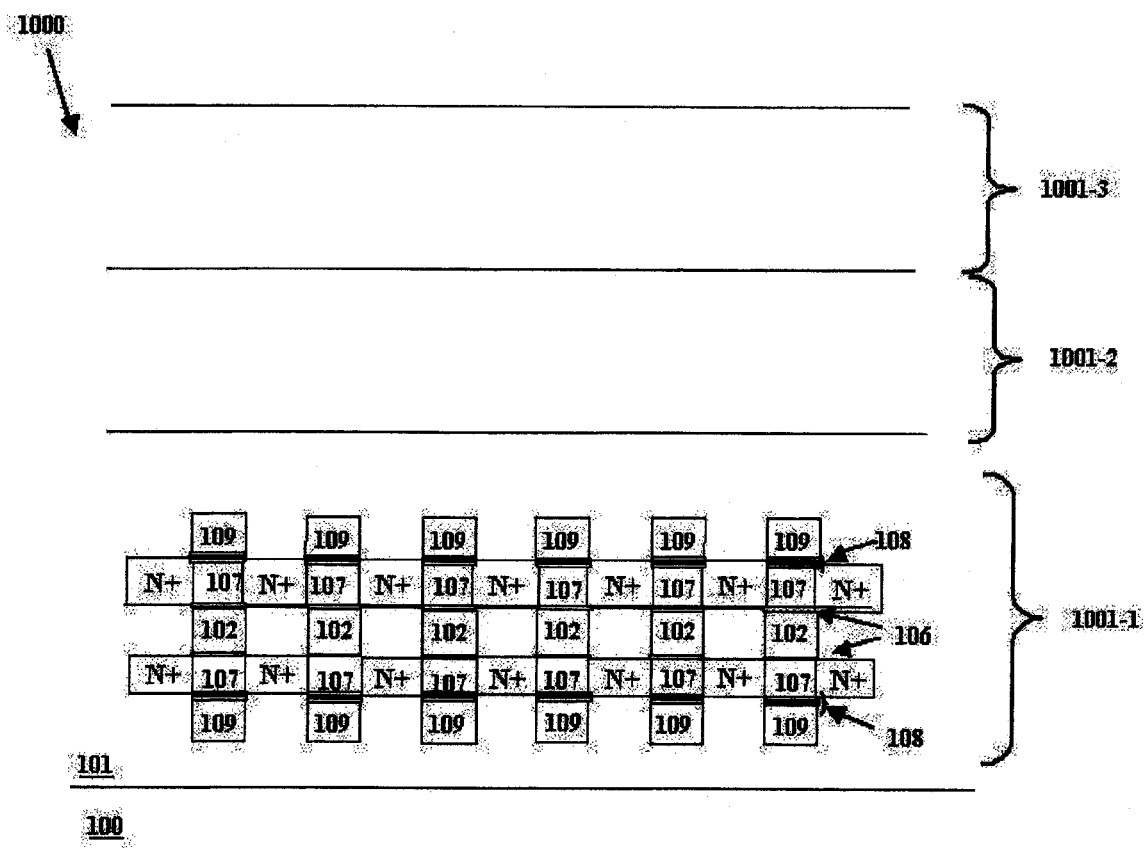
FIG. 10 shows structure 1000, which is also formed by stacking dual-gate NAND-type non-volatile memory devices; in structure 1000, each access gate electrode has two gate dielectric layers.

FIG. 9 shows structure 900, also including multiple layers of dual gate memory cells. In structure 900, however, each memory gate electrode serves two distinct devices. FIG. 10 shows structure 1000, which is another alternative structure allowing multiple layers of dual gate memory cells. In structure 1000, each access gate electrode serves two distinct devices. Structures 900 and 1000 may be formed by appropriately modifying the relevant methoding sequence discussed above and shown in FIG. 3.

Returning to FIG. 5A, consider the case in which one memory device in NAND string 501 is programmed. NAND string 501 has a bit line contact "Bit1" and a source contact "source1". Suppose the dual-gate memory cell to be programmed is the one having WL(m)b as the memory gate electrode word line and WL(m)a as the access gate electrode word line. To program this memory cell, a ground voltage or a small voltage is applied to bit line contact "Bit1," and the source contact "source1" may either be allowed to electrically float or be applied a positive voltage between zero and 10 volts. In one embodiment of the present invention, the source contacts "source1" and "source2" of NAND strings 501 and 502 are connected together. The select gate electrodes SG1a and SG2a are applied a positive select gate program pass voltage between 1 volt and 13 volts. A typical voltage is 7 volts, with the optimal voltage being determined through experimentation. Word lines SG1b and SG2b may also be applied this voltage, a small voltage or may be left to electrically float. The access gate electrode word lines, WL1a to WL(m-1)a, are each applied a positive program pass voltage between 1 volt and 10 volts, with a typical voltage of 7 volts. Again, an optimal voltage value may be determined through experimentation. All other access gate electrode word lines WL(m)a to WL(n)a and the select gate electrode word lines SG3a, SG4a, SG3b and SG4b may be left floating. A programming voltage between 9V and 18V (typically, 15V) is applied to the word line WL(m)b. Again, an optimum value is determined through experimentation. All other memory cell word lines, WL1b to WL(m-1)b, can be either applied a small voltage or be allowed to electrically float. In this way, a charge inversion layer is formed in the active semiconductor layer (e.g., active semiconductor layer 107) close to the gate electrode of the memory device being programmed. In addition, this inversion channel is tied close to the voltage that is applied to bit line contact "Bit1" during the programming operation, by connecting the inversion channel to bit line contact "Bit1" through the inversion channels and sources and drains regions of all the access devices and active select devices between the bit line contact "Bit1" and the inversion channel of the memory device being programmed. Programming is achieved by tunneling electric charge from the inversion channel of the memory device being programmed to the charge trapping sites within the memory device's gate dielectric layer (such as dielectric layer 108 of FIG. 3).

To reduce "program pass disturb" on memory cells within the same NAND string that has a memory cell being programmed, the program pass voltage is set at a voltage level that does not affect the charge stored in the memory devices of the NAND string between the bit line contact and the memory cell being programmed. The allowable program pass voltages may be determined experimentally (e.g., by taking a dual-gate memory device and confirming that applying the program pass voltages under consideration to the access gate electrode does not affect the threshold voltage of its associated memory device).

Figure 6:
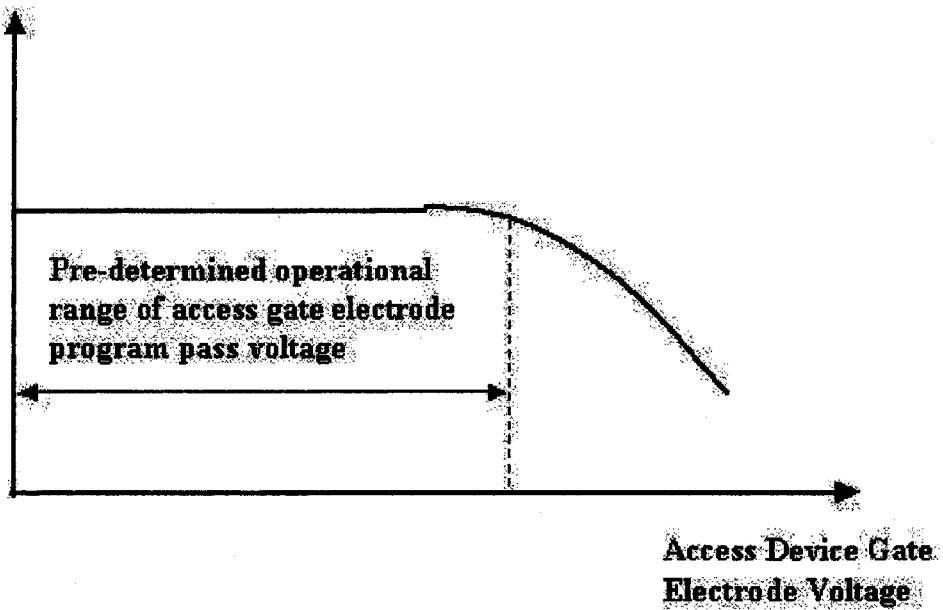
FIG. 6 is a chart showing the threshold voltage of the memory device, as a function of the access gate electrode voltage.

FIG. 6 shows the effect of access gate electrode voltage on the threshold voltage of the memory device within the same dual-gate device. Within the operational range of program pass voltages applied to the gate electrode of an access device, the threshold voltage of the associated memory device stays substantially constant. At higher program pass voltages, the memory device's threshold voltage decreases. Thus, when any source or drain within a NAND string is tied to a particular voltage and is not allowed to electrically float, little electrical interaction occurs between the access device and its associated memory device, when an allowed program pass voltage is applied to the access gate electrode. Note that complete electrical isolation between the access device and its associated memory device is not necessary. It is sufficient that, when a voltage within the operational range of program pass voltages are applied, a spatial variation in electrical interaction is created such that some regions of the memory device are electrically isolated from the access device.

Figure 11:
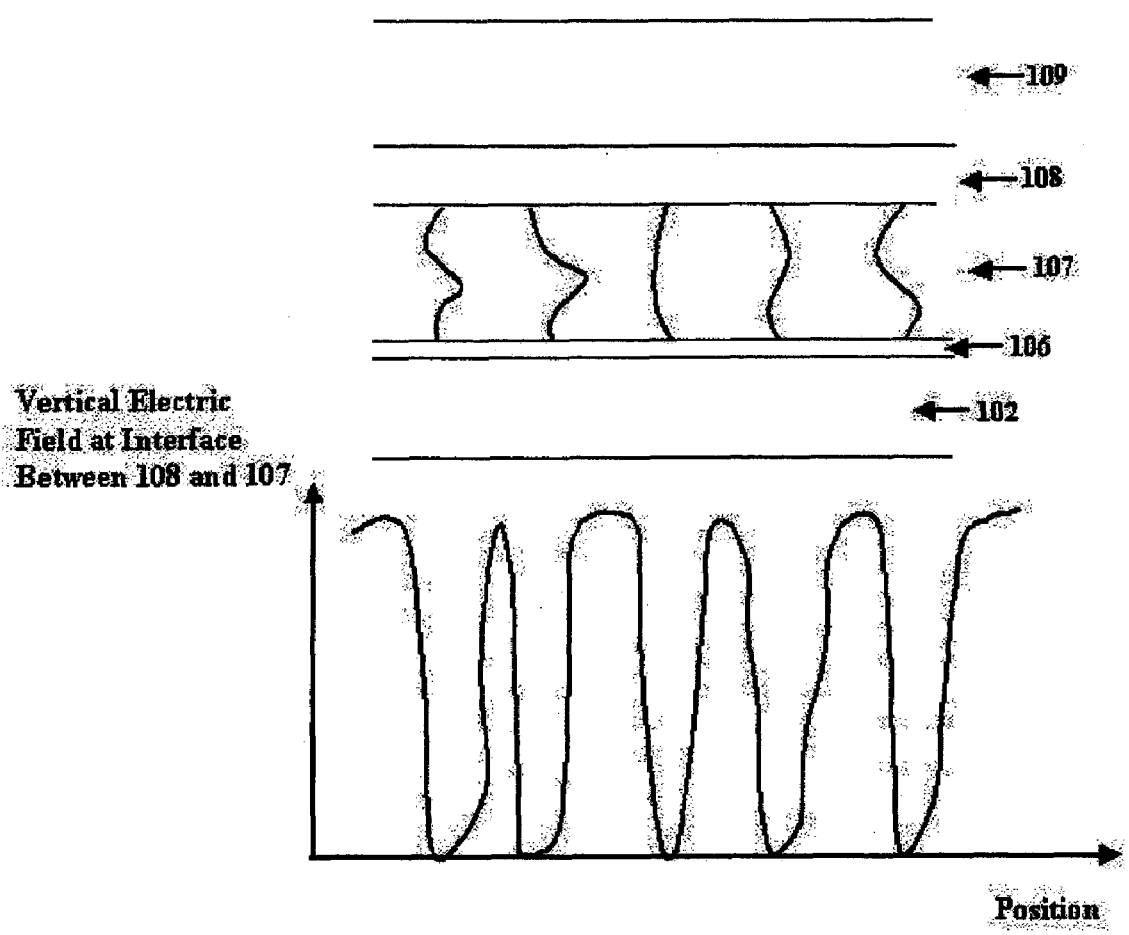
FIG. 11 shows the effect of active semiconductor layer 107 (e.g., polycrystalline silicon) on the spatial variation in electrical interaction between the access device and the memory device in one dual-gate device, when the access device is rendered conducting by a gate electrode voltage within a predetermined voltage range.

FIG. 11 shows the anisotropic variation in electric field at the interface between active semiconductor layer 107 and dielectric layer 108, when a voltage within the operational range of the program pass voltages is applied to the gate electrode of the access device, while the source region is tied to a particular voltage and is not allowed to float. As shown in FIG. 11, active semiconductor layer 107 is a polycrystalline material made up of grains of semiconductor material. Each grain may consist of an internal region, which is crystalline (often with many internal crystal defects), and an external grain boundary, which has a structure similar to an amorphous semiconductor. In the active semiconductor region, the channel region of either device of the dual-gate structure may contain one or more grain boundaries, which shield the device from a depletion region that may form on the active semiconductor by the opposite device. Such depletion regions may extend through the grains from one device to the other device, but the grain boundaries provide electrical shielding, when the applied voltage is within the operational range discussed above.

To inhibit programming of a memory device in an adjacent NAND string that shares the same word line with a memory device being programmed (e.g. in FIGS. 5A and 5C, inhibiting programming in NAND string 502, while NAND string 501 is being programmed), there are two main approaches. First, the inversion channel formed in NAND string 502 (the inhibited NAND string) is allowed to electrically float. Alternatively, the active semiconductor layer common to the memory devices in NAND string 502 may be allowed to electrically float. Under either method, a resulting strong electrical interaction between the access devices and the memory devices in NAND string 502 exists that reduces the electric field across gate dielectric 108 in the memory device, hence inhibiting programming. Consequently, a much reduced electric charge tunneling occurs between the inhibited memory device's gate electrode and the active semiconductor layer. A further technique for inhibiting programming in NAND string 502 ties the bit line contact "Bit2" (FIG. 5A) to a voltage between 5 volts to 15 volts (typically, 9 volts). An optimal value for this voltage applied on the bit line contact can be determined experimentally.

FIGS. 5A and 5C illustrate allowing the inversion channel formed in inhibited NAND string 502 to electrically float. The voltages applied to NAND string 501 during the programming operation have already been discussed above. During programming, a voltage close to the voltage applied to both word lines SG1a and SG2a is applied to bit line contact "Bit2" in NAND string 502. Thus, node 502x in FIG. 5A is allowed to reach a voltage slightly lower than that applied to bit line contact "Bit2". When the program pass voltage is applied to each of the access gate electrode word lines WL1a through to WL(m-1)a, an inversion layer is allowed to form in all associated access devices in NAND string 502. Applying the programming voltage to word line WL(m)b also forms an inversion channel in the memory device of the dual-gate device in inhibited string 502. In this way, this inversion channel is connected through other inversion channels and source and drains to node 502x. Because of the strong capacitive coupling between the access gate electrode word lines, on one hand, and the inversion channels and the source and drains regions, on the other hand, node 502x and all the connected inversion channels and the sources and drains regions rise in voltage and electrically float independent of the voltage applied to bit line contact Bit2. During programming, source contact "Source2" of NAND string 502 may either be allowed to electrically float or may be tied to a positive voltage between zero volts and 10 volts. In one embodiment of the present invention, the sources contacts "source1" and "source2" may be tied together. This strong electrical interaction between the access devices and the memory devices inhibits programming of the memory cell in NAND string 502 that has its memory gate electrode word line WL(m)b.

Inhibiting programming in NAND string 502 can also be achieved by electrically floating bit line contact "Bit2" during programming. In this way, little or no inversion occurs in any dual-gate device within the active semiconductor layer of NAND string 502, thus further allowing the active semiconductor layer (e.g., active semiconductor layer 107) to electrically float. Consequently, capacitive coupling results between the access devices and the memory devices within this NAND string 502. This capacity coupling results in the necessary program inhibition in the memory cell in NAND string 502 that has WL(m)b as its memory device gate electrode. Under this method, select dual-gate devices with word lines SG1a, SG1b, SG2a and SG2b, may not be necessary for the operation of the NAND memory device, thus further increasing the memory density achievable.

In summary, during programming, program pass disturb immunity in the memory cells of NAND string 501 in FIG. 5A is achieved by good electrical isolation between access devices and memory devices, when program pass voltages within the operating range are applied to the access devices. To achieve good program inhibit in the adjacent NAND string 502, good electrical interaction is needed between the access devices and the memory devices. Program disturb and program pass disturb concern the voltage to be applied to the non-selected memory gate electrode word lines WL1b through WL(m-1)b. These word lines may be allowed to float or may be tied to a pre-determined voltage that has been previously optimized to reduce these disturb mechanisms. In one embodiment, this voltage is between zero volts and 5 volts.

Figure 7:
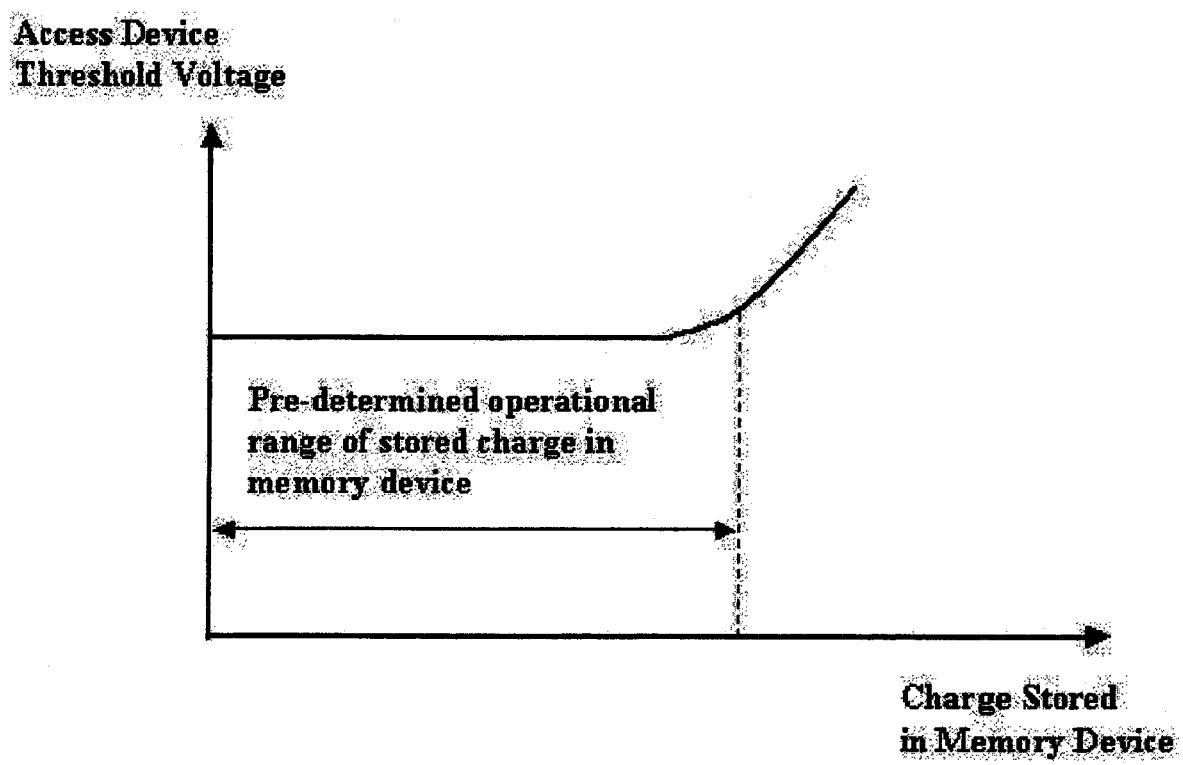
FIG. 7 is a chart showing the threshold voltage of the access device, as a function of the stored electric charge in the memory device of a dual-gate memory cell.

The read operation is discussed with reference to FIG. 5A. Suppose the memory cell to be read is the one in NAND string 501 with memory gate electrode word line WL(m)b. To read this cell, a small read voltage (e.g., 1 volt) between the programmed threshold voltage and the erased threshold voltage is applied to word line WL(m)b. At the same time, a small voltage (e.g., between 0.5 volts and 4 volts; preferably, 1 volt) is applied to bit line contact "Bit1" of NAND string 501. Source contact "Source1" of NAND string 501 is held at a lower voltage (e.g., ground voltage) than bit line contact "Bit1." All access gate electrode word lines between bit line contact Bit1 and source contact Source1, except for word line WL(m)a, but including those of the select devices SG1a, SG2a, SG3a and SG4a, are applied a read pass voltage that is usually higher than the read voltage, but lower than the previously discussed program pass voltage. The read pass voltage may be provided between 1 volt and 8 volts, and typically, 4 volts. All other memory cell gate electrode word lines are either left electrically floating or are tied to a small voltage. The requirement for a good electrical isolation during programming of a NAND string having a node in the active semiconductor layer applied a particular voltage results also in the lower read pass voltage applied having an even lesser effect on the stored charge in the associated memory devices in NAND string 501. A lower bound to the electrical isolation between the access device and the associated memory may be determined from the charge stored in the memory device and the effect that this charge has on the threshold voltage of the access device. FIG. 7 shows the effect of increasing the stored charge in the memory device on the associated access device's threshold voltage. Within a predetermined range of stored charge previously determined through experimentation and manufacturing optimization, the access device's threshold voltage may be made unaffected or little affected by the stored charge. In one embodiment, the access device's threshold voltage is unaffected or little affected when the stored charge is within the range of zero $C/cm^2$ to 2 $\mu C/cm^2$.

During the read operation, bit line contact "Bit2" of NAND string 502 in FIG. 5A can be left electrically floating or can be tied to a voltage close to ground voltage. Under either approach, read pass disturb in the NAND string being read is minimized. Also, read disturb and read pass disturb in adjacent NAND strings sharing the same word lines can also be minimized.

The erase operation is next discussed with reference to FIG. 5A. Erase is usually carried out using one of two methods, with many NAND strings being erased at the same time. The first erase method requires applying the ground voltage or a negative voltage to all the memory cell word lines in the memory block of NAND strings and may include applying the ground or negative voltage to the select devices of FIG. 5A. At the same time, a large positive voltage may be applied to all the bit line contacts and sources. As shown in FIG. 5A, the bit line contacts and source line contacts are "Bit1", "Bit2", "Source1" and "Source2," respectively. The voltage on these nodes may be between 7 volts and 15 volts. In this way, electric charge can tunnel out of the memory devices.

The second erase method also requires applying the ground voltage or a negative voltage to all the memory cell word lines in the memory block of NAND strings and may include the select devices. At the same time, a large positive voltage (e.g., between 7 to 20 volts) may be applied to all the access gate electrode word lines in the same block of NAND strings, while the bit line contacts and source regions all electrically float. Strong electrical interaction between the access devices and the memory devices ensures charge tunneling from the memory devices and allows erase to take place.

Based on the teachings above, very high density semiconductor devices may be formed by repetitive structures of the dual-gate devices discussed above, as illustrated by structure 800 in FIG. 8. FIGS. 9 and 10 show additional dual-gate device structures that are stacked in a repetitive manner to achieve a high circuit density. Specifically, FIG. 9 shows structure 900 which includes charge storing gate dielectric layers 108 on both sides of gate electrode layer 109 (i.e., using the same gate electrode to control more than one memory device). FIG. 10 shows structure 1000 which includes non-charge storing gate dielectric layers 106 on both sides of gate electrode layer 102 (i.e., using the same gate electrode to control more than one access device).

The above detailed description is provided to illustrate the specific embodiments of the present invention disclosed herein and is not intended to be limiting. Numerous variations and modifications of the present invention are possible within the scope of the present invention. The present invention is set forth in the accompanying claims.

I claim:

1. A method for fabricating a dual-gate memory cell, comprising:
   forming a first conductor in an insulator layer;
   forming a trench in the insulator layer, the bottom of the trench exposing the conductor;
   providing a first dielectric layer adjacent the exposed conductor;
   providing a semiconductor layer on the first dielectric layer;
   providing a second dielectric layer over the semiconductor layer; and
   providing a second conductor adjacent the second dielectric layer; and
   wherein one of the first and second dielectric layers is charge-storing and the other of the first and second dielectric layers is non-charge storing, and wherein the semiconductor layer is provided a thickness such that when a voltage selected from a predetermined range of voltages is applied to the one of the first and second conductors adjacent to the non-charge storing dielectric layer, the charge stored in the charge-storing dielectric layer is unaffected.

2. A method as in claim 1, further comprising providing source/drain regions in the semiconductor layer and wherein when a voltage is applied to the conductor layer adjacent the non-charge storing dielectric layer and the source/drain regions are allowed to float, the conductor layer adjacent the non-charge storing dielectric electrically interacts with the charge in the charge-storing dielectric layer.

3. A method as in claim 1, wherein the semiconductor layer comprises polycrystalline semiconductor material.

4. A method in claim 3, wherein the polycrystalline semiconductor material is selected from the group consisting of polycrystalline silicon, polycrystalline germanium, and a combination of polycrystalline silicon and polycrystalline germanium.

5. A method as in claim 1, wherein the charge-storing dielectric layer comprises silicon oxide and silicon nitride materials.

6. A method as in claim 5, wherein the silicon nitride material is selected from the group consisting of silicon nitride, silicon oxynitride, a silicon-rich silicon nitride and a silicon nitride having spatial variation of the silicon and oxygen contents.

7. A method as in claim 6, wherein the charge-storing dielectric layer comprises a floating conductor.

8. A method as in claim 7, wherein the floating conductor comprises nano-crystals placed between a gate electrode and the semiconductor layer.

9. A method in claim 8, wherein the nano-crystals comprises a material selected from the group consisting of silicon, germanium, tungsten, and tungsten nitride.

10. A method as in claim 1, further comprising connecting the semiconductor layer to a predetermined voltage when the voltage selected from a predetermined range of voltages is applied.

11. A method as in claim 1, wherein the stored charge in the charge storing dielectric layer is within the range of zero $C/cm^2$ to $2\ \mu C/cm^2$.

* * * * *